Figure 1:
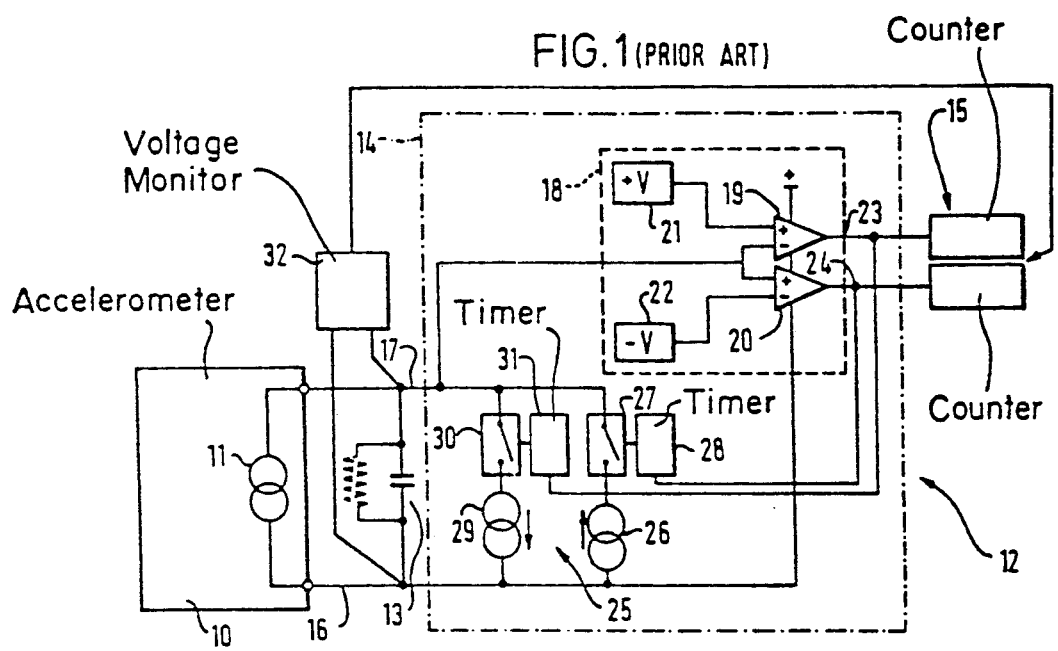

United States Patent [19]
Watson

[11] Patent Number: 5,128,610
[45] Date of Patent: Jul. 7, 1992

[54] CURRENT-TO-FREQUENCY CONVERTER

[75] Inventor: Norman F. Watson, Edinburgh, Scotland

[73] Assignee: GEC-Ferranti Defence Systems Limited, Middlesex, United Kingdom

[21] Appl. No.: 489,544

[22] Filed: Mar. 7, 1990

[30] Foreign Application Priority Data

Mar. 22, 1989 [GB] United Kingdom ............ 8906610

[51] Int. Cl.⁵ .................. G01R 19/26; G01R 17/06
[52] U.S. Cl. .................. 324/120; 73/517 R; 324/111
[58] Field of Search ............ 324/120, 99 D, 111; 73/504, 517 R; 307/356, 358

[56] References Cited

U.S. PATENT DOCUMENTS

| | | | |
|---|---|---|---|
| 3,482,116 | 12/1969 | James | 324/120 |
| 3,840,807 | 10/1974 | Zschimmer | 324/111 |
| 3,857,097 | 12/1974 | Juels | 324/120 |
| 3,877,020 | 4/1975 | Brunsting et al. | |
| 4,082,998 | 4/1978 | Marriott | 324/111 |

FOREIGN PATENT DOCUMENTS 2174264A 10/1986 United Kingdom.

OTHER PUBLICATIONS

2119 E.D.N. *Electrical Design News* 30(1985) May, No. 11 Boston, Massachusetts, USA.

*Primary Examiner*—Ernest F. Karlsen
*Attorney, Agent, or Firm*—Kerkam, Stowell, Kondracki & Clarke

[57] ABSTRACT

A current-to-frequency converter 12' (FIG. 3) for use with an accelerometer 10 comprises a storage capacitor 13 which receives the accelerometer current and develops a charging voltage, reset charging means 25 which delivers timed charges to offset the voltage by predetermined amount and voltage sensing means 14' which senses the charging voltage reaching positive or negative thresholds in order to initiate a reset and offsetting the voltage. The polarity of charging voltage at which reset is triggered determines that polarity threshold as being half the magnitude of the offset voltage but the opposite polarity threshold of greater magnitude so that the voltage on the reset capacitor avoids it. If the acceleration current direction changes altering the charging voltage polarity the first reset at this high magnitude threshold existing for that polarity causes it to adopt the lower magnitude of half the reset offset voltage for subsequent resets and the opposite polarity adopt a threshold of the greater magnitude.

15 Claims, 3 Drawing Sheets

CURRENT-TO-FREQUENCY CONVERTER

This invention relates to the measurement of a quantity represented by an electrical current in which both the magnitude and direction of current are variable and particularly to processing the current as a frequency by means of a current-tofrequency converter.

In such a converter the current is used to charge a storage capacitor which is also connected to a reset generator by which the capacitor can be discharged by charging in an opposite sense.

Sensing means senses the voltage on the capacitor as a result of the charging current and at a predetermined switching threshold magnitude connects the reset generator to charge the capacitor in an opposite sense and offset the voltage on it by a fixed amount to assume a predetermined reset level, from which the capacitor is charged by the current until it reaches the said predetermined switching magnitude again. The charging and resetting of the capacitor is repeated at a rate which is directly proportional to the current value whose value, or the value of a variable it represents, is given by the capacitor reset requency or a simple function thereof.

In practice the value of the capacitor voltage may also be sampled and digitised by additional circuitry to provide a fine correction.

In many instances not only the current magnitude but also its direction is unknown and this presents a conflict in performing the above measurement by conversion.

One example of a device which produces a current that varies in both magnitude and direction is an inertial accelerometer wherein the current represents both magnitude and direction of sensed acceleration.

It is also known to measure acceleration or the time integral thereof, that is, velocity, by subjecting the acceleration-representing current to a voltage to frequency conversion in the manner outlined above of charging and resetting a capacitor and counting the rate at which resets are effected (acceleration) or number of resets in a predetermined or a longer time interval (velocity).

Accelerometers generally have to respond to acceleration forces in opposite directions along a rectilinear, or about an angular, axis such that the capacitor of the converter may be charged to either a positive switching threshold voltage or to a negative switching threshold voltage and it is usual to have the switching threshold voltage magnitude the same for each direction of acceleration and slightly more than half of the magnitude of the capacitor voltage offset caused by its reset.

In particular, if the charging voltage is offset by exactly twice the threshold magnitude at which reset is effected for either polarity of threshold, that is, either acceleration direction, then the average voltage on the capacitor for each reset cycle is zero. If the voltage is offrset by a different amount in relation to either polarity threshold the storage capacitor carries a mean voltage which is susceptible to leakage by internal conductance of the capacitor and/or by input impedance of any voltage sensing circuitry connected thereto and a resultant inaccuracy in frequency conversion.

Thus for bidirectional operation it is clear that switching threshold magnitudes of both polarities should be equal and each as close as possible to half of the reset voltage offset.

However, if the charging voltage is offset by exactly twice the threshold magnitude for either polarity to derive an average capacitor voltage of zero a charging voltage of one switching threshold value is offset to a value equal to the switching threshold value of the opposite polarity and with or without the impetus of any mechanical or electrical noise in the system is capable of triggering a reset at this opposite-polarity threshold and establishing an oscillation or 'chatter' between reset states.

Thus the conflict has hitherto prevailed between having a reset voltage which is symmetrical in value about zero and having equal values of switching thresholds, that is, equally positive-going and negative-going, at which the resets are effected without the problems of reset chatter.

It is common practice to mitigate these contradictory effects by having reset switching threshold magnitudes slightly greater than the offset voltage of the reset charage and attempting to measure the effects of such capacitor voltage leakage to correct the frequency conversion results.

It is emphasised that such an acceleration is merely one form of device that produces what may conveniently be termed a bidirectional current, that is, a current which may flow in either direction, and to which the above outlined conflict is important.

It will be realised that such bidirectional current may be produced either directly from a device or as a function of applying some unknown quantity, such as a voltage, to an impedance element of a device which defines such a current for conversion.

In view of the foregoing it is an object of the present invention to provide a current-to-frequency converter which is suited to operation with bidirectional currents by resolving the above outlined threhold-reset conflict.

According to the present invention a current-to-frequency converter includes a storage capacitor operable to receive current from a generator thereof to charge positively or negatively with respect to a datum potential in accordance with direction and develop a related charging voltage thereon of positive or negative polarity with respect to said datum, reset means, operable to perform a reset operation on the capacitor, comprising voltage sensing means operable to determine when the charging voltage on the capacitor has reached a preset threshold value and reset charging means responsive to determination by the voltage sensing means to apply a predetermined charge to the capacitor in an opposite sense to the current received from said generator to offset the charging voltage thereon by a predetermined reset magnitude and output means to monitor the number of reset operations occurring aover a period of time, the reset means being arranged in response to a reset operation, indicative of the polarity of the charging voltage, to adopt for that polarity a lower reset threshold magnitude of substantially half of the offset voltage magnitude and for the opposite polarity a higher reset threshold magnitude in excess thereof.

Figure 2:
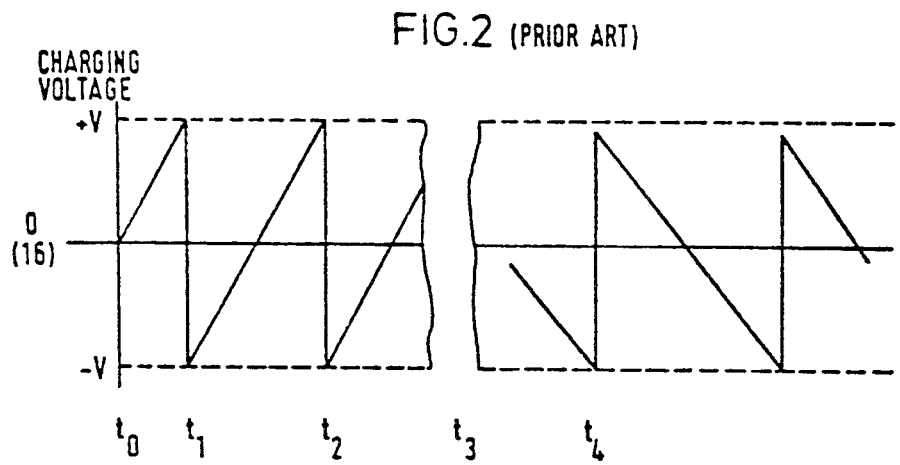
Figure 3:
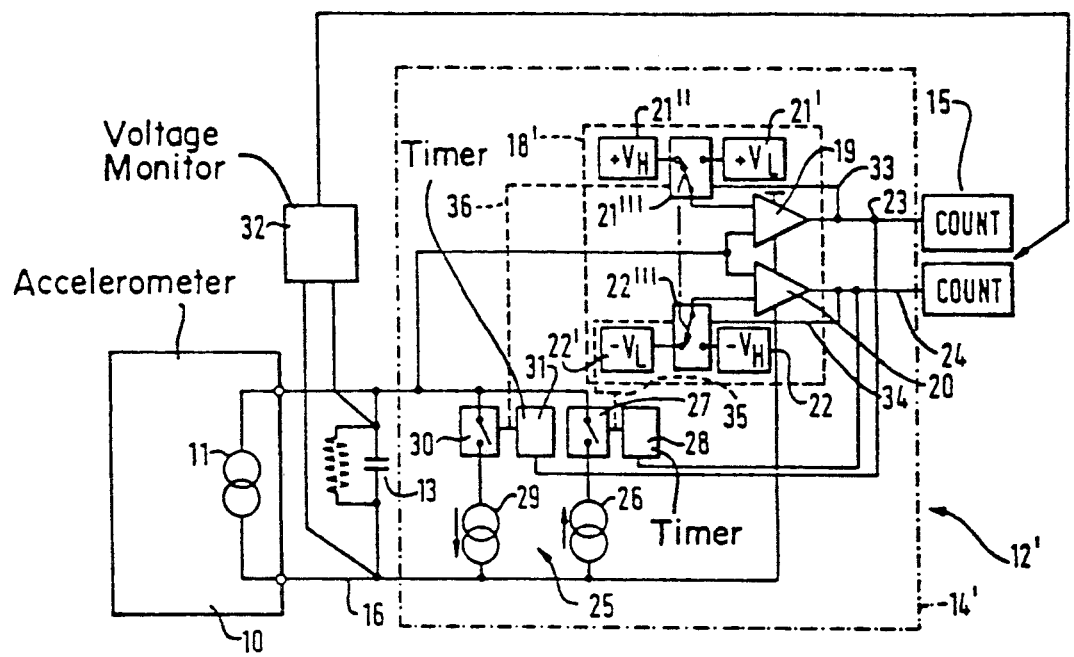
Figure 4A:
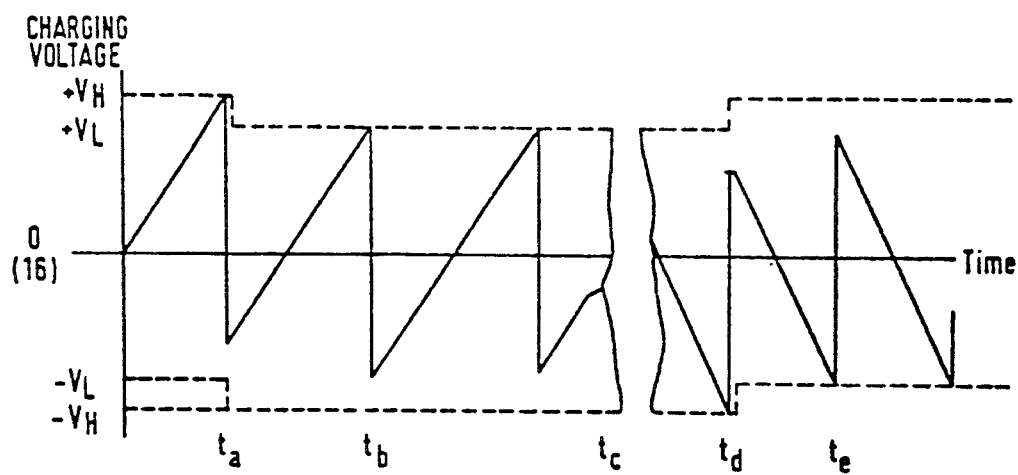
Figure 4B:
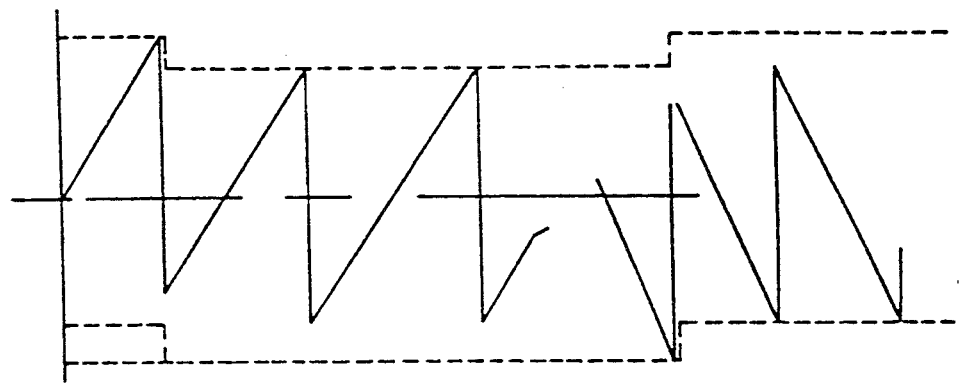
Figure 5:
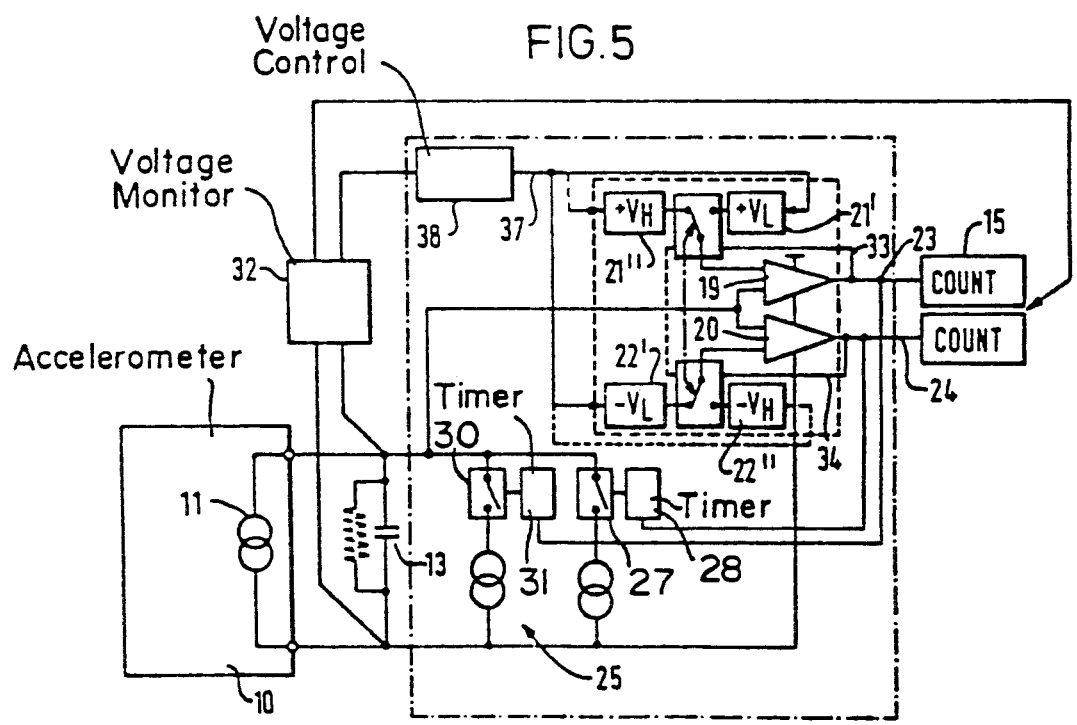

An embodiment of the invention will now be described by way of example with reference to the accompanying drawings, in which:

FIG. 1 is a circuit block diagram of a known form of current-to-frequency converter used with an accelerometer, FIG. 2 is a graphical representation of capacitor charging voltage as a function of time illustrating operation of the converter of FIG. 1 with equal reset threshold magnitudes for both polarities of voltage, FIG. 3 is a circuit block diagram of a current-to-frequency converter according to the present invention used with an accelerometer, FIG. 4 is a graphical representation of capacitor charging voltage as a function of time illustrating operation of the converter of FIG. 2 in accordance with the present invention, and FIG. 5 is a circuit block diagram of a current-to-frequency converter based upon that of FIG. 3 but shown additional refinements.

Referring to FIG. 1 an accelerometer 10 is of conventional type, its only feature of importance to the present invention being that when subject to an acceleration force along a sensitive axis it passes an electrical current which has a magnitude proportional to the acceleration magnitude and flows in a direction which is dependent on the acceleration direction along the sensitive axis.

That is, in accordance with the invention and for the purposes of explanation in this specification the accelerometer 10 may be considered as effectively comprising a bidirectional direct current generator 11.

The current delivered is evaluated and utilised in practice by a current-to-frequency converter 12 which includes a storage capacitor 13, storage capacitor reset means 14 and output means 15.

The storage capacitor 13 is connected across the accelerometer current source between a datum terminal 16 and a terminal 17 so that in dependence on current direction the capacitor is charged either positively or negatively with respect to a datum terminal 16 and develops a related charging voltage thereon which is positive or negative with respect to the datum terminal. The datum terminal is conveniently maintained at zero volts with respect to any other electrical circuitry associated with the accelerometer.

The capacitor reset means 14 comprises voltage sensing means 18 which is operable to determine when the charging voltage on the capacitor has reached a present threshold value. As indicated, the charging voltage may assume a magnitude that is of positive or negative polarity with respect to the datum terminal 16 and the voltage sensing means is illustrated as a pair of voltage comparators 19, 20 associated on each with positive- and negative-going charging voltages, which comparators receive a common input from terminal 17 of the capacitor and voltage levels defined by individual threshold level generators 21, 22 that are positive and negative respectively with respect to the datum but of equal magnitude. The comparator outputs, at terminals 23 and 24 respectively, are each arranged to switch between two levels when the charging voltage sensed on the capacitor crosses the threshold level.

The reset means 14 also comprises reset charging means 25 by which a predetermined charge is applied to the capacitor, still charged from the accelerometer, but in an opposite sense to offset the voltage thereon by a predetermined reset magnitude.

This may be achieved by applying a charging current for a predetermined time period and to this end for each sense or polarity of reset charge a current source, switching or gating means and timing means is show. Each switching or gating means may be a semiconductor device and the timing means a monostable circuit triggered by a pulse or change in output state of one of the comparators 19, 20 to provide a current path from the associated source to the capacitor for said predetermined time period.

Current source 26 is connected such that its current charges the capacitor in a sense to provide a positive-going reset voltage offset on the capacitor by way of switching means 27 that is controlled by timing means 28 in receipt of a trigger from output 24 of comparator 20. Current source 29 is connected such that its current charges the capacitor in a sense to provide a negative-going reset voltage offset on the capacitor by way of switching means 30 that is controlled by timing means 31 in receipt of a trigger from output 27 of comparator 19.

The outputs 23, 24 of the comparators are coupled to output means 15 which may take the form of a bidirectional counter of the comparator output state changes.

Considering operation of the arrangement thus far described reference is made also to FIG. 2 which shows a waveform of storage capacitor voltage plotted against time with an ordinate datum corresponding to terminal 16 and switching voltage threshold levels $+V$ and $-V$ of equal magnitude.

Asssuming a constant acceleration in one direction along the sensitive axis a constant charging current is generated which results in a linearly increasing charging voltage from time $t_0$ to $t_1$ when threshold level $+V$ is reached. The comparator 23 produces an output change that triggers timing means 31 to cause source 29 to apply a reset charge in such a sense and for such a time that the capacitor voltage at 17 is offset by twice the threshold magnitude to $-V$, the current magnitude enabling reset at such a rate as to approach an instantaneous 'fly-back'. As soon as the capacitor voltage beggings to be offset below the level $+V$ the comparator 19 returns to its original output state but timing means 31 completes the operation. The accelerometer current continues to charge the capacitor with a positive-going voltage until once again the threshold $+V$ is reached and reset operation effected at time $t_2$.

It will be seen that the number of resets effected in any time period, and counted by output means 15, is a function of the accelerometer current and provides a measure of the acceleration. Furthermore if the numbers of resets for such time periods are accummulated for a longer time the integration with respect to time is effected and a measurement of velocity, most useful in inertial navigation, is provided by the output means counter.

If the acceleration direction changes, as at time $t_3$, the charging current reverses and the charging voltage on the capacitor becomes of negative polarity with respect to datum 16, increasing in magnitude to $-V$ at $t_4$ when comparator 20 changes its output state, triggering timing means 28 to close switching means 27 and reset the comparator 13 with a reset charge current at the same rate and for the same time interval as that for source 29 when a positive threshold $+V$ is crossed. The capacitor voltage of $-V$ is offset to a positive going value before the accelerometer current ramps it negatively again.

It is also known to measure the voltage appearing across storage capacitor 13 by means shown at 32. If at the end of the time period for which resets are counted the capacitor is part way through a charging cycle the current may be computed from the capacitor value and voltage rise in the cycle portion and employed to modify the value of current given at output means 15.

The arrangement described is known in principle although practical systems may effect voltage sensing and reset by means of components common to both polarities and switched as to voltage polarity and current direction as appropriate.

It will be seen that as outlined hereinbefore the voltage to which the storage capacitor is reset is in effect a threshold level but to prevent is resetting back again immediately and causing an oscillation or chatter that destroys the relationship between acceleration and counted resets the reset charge must be slightly less, the level being a compromise between a non-zero average voltage on the capacitor and proximity to the threshold at which any mechanical or electrical noise in the system may take it over the threshold and result in the aforesaid oscillation.

Hitherto the conflicting problems have not been resolved satisfactorily but in accordance with the present invention this resolution is achieved by an arrangement such as illustrated in FIG. 3.

The arrangement is somewhat similar to that of FIG. 1 and corresponding elements are given identical references whilst corresponding but dissimilar elements are given the same references but primed.

The circuit differs in that within the reset means 14' the voltage sensing means 18' has for each comparator 19 and 20 two threshold sources which have different magnitudes of voltage. For the comparator 19 the threshold sources 21' and 21" are connected to supply the comparator by way of a bistable selection switch 21''' which selects one source or the other in dependence on which state it is placed in by an external signal on line 33. Comparator 20 has associated therewith two threshold voltage sources 22' and 22" coupled to the comparator by way of bistable selection switch 22''' which may be operated or toggled by signal on line 34.

The threshold sources 21' and 22' have a magnitude of threshold voltage substantially equal to half of the reset voltage offset provided by the reset charging means 25, and the sources 21" and 22" have a threshold voltage of higher magnitude, conveniently of the order of 20% higher.

The sources 21' and 22' may be conveniently said to provide a lower threshold magnitude, $+V_L$ and $-V_L$ respectively, and sources 21" and 22" to provide a higher threshold magnitude, $+V_H$ and $-V_H$ respectively.

Bistable selection switches 21''' and 22''' are coupled such that when the higher reset threshold source 21" is connected to comparator 19 the lower reset threshold source 22' is connected to comparator 20 and vice versa.

Furthermore, as shown the selection switch 2''' is toggled by an output at 23 of comparator 19 to couple the lower reset threshold to comparator 19, if it is not already so disposed, and in so doing couple high reset threshold source 22" to comparator 20, whilst selection switch 22''' is toggled by an output at 24 of comparator 20 to couple the lower reset threshold source 22' to comparator 20 and higher reset threshold source 21" to comparator 19.

Considering operation of this circuit with reference to FIG. 4, the different threshold associated with opposite polarities of capacitor charging voltage will be seen.

The circuit may be arranged such that at switch-on the linked selection switches 21''' and 22''' assume a particular configuration, which may be beneficial if a particular acceleration direction is to be expected, or may assumed a configuration at random, such as the one shown, where the threshold for a positive-going charging voltage is higher than for a negative-going charging voltage.

If the acceleration direction results in a charging voltage which increases with positive polarity, this reaches the higher reset threshold $+V_H$ at time $t_a$ and comparator 19 gives a change of output state. As well as being registered by output means 15 this initiates a reset charge from reset charging means 25 which offsets the capacitor voltage in a negative-going sense by twice the value of the lower reset threshold magnitude, that is, 2.31 $V_L$, to $+V_H - 2.V_L$ after which the accelerometer current beings to charge the capacitor in a positive-going sense again. The output change of comparator 19 also toggles selection switches 21''' and 22''' such that the lower reset threshold $+V_L$ of source 21' is applied to comparator 19 and higher reset threshold $-V_H$ of source 22" is applid to comparator 20.

The charging voltage now reaches the new positive threshold $+V_L$ at time $t_b$ and the reset operation offsets it in a negative-going sense to $-V_L$ after which it beings a positive-going ramp again. The change of output of comparator 20 is againg registered by output means 15 but no change of selection switches is effected and the system settles to a repetitive routine in which the capacitor voltage swings about the datum, leaving no residual voltage to cause errors by leakage and the voltage to which reset is well away from risk of crossing the negative threshold $-V_H$ and triggering an arroneous reset.

If the acceleration direction does change, such as at $t_c$, then the capacitor changes with a negative polartiy voltage to the threshold $-V_H$ at $t_d$ whereupon the reset operation initiated by output change of comparator 22, giving a capacitor voltage offset of 2.$V_L$, also results in toggling of selection switches 22''' and 21''' so that in the next ramping of charging voltage on the storage capacitor the reset is initiated at a lower threshold magnitude of $-V_L$ at time $t_e$ and voltage offset of reset keeps the capacitor voltage clear of the positive threshold of $+V_H$.

Thus apart from the first reset operation after a change of acceleration direction the current-to-frequency converter functions accurately in the manner of the idealised coverter of FIG. 1 but without the disadvantages thereof outlined above and in practice even the small errors of charging time caused by the initial charging to a higher threshold can be identified and compensated for or neglected if infrequent for a sufficiently long measurement time.

It will be appreciated that the circuit form of FIG. 3 is described to help understand the invention and that modifications may be made, along the lines suggested for FIG. 1, in terms of not duplicating the comparators and threshold sources of the vooltage sensing means or reset charging means but switching between the opposite directions and polarities.

As described, the output change of the voltage sensing means operates selection switches 21''' and 22''' but it will be undertood that these switches could equally be operated by operation of the switching means 27 and 30 of the reset charging means and indicated by broken lines 35 and 36, one effect of this being to ensure that the threshold are not changed until the capacitor voltage is in the process of being offset, or the selective switches 21''' and 22''' may be omitted and the threshold sources 21', and 21" and 22', 22" energised as appropriate to provide the threshold combinations.

It will be appreciated from FIG. 4 that if the accelerometer is subjected to very high acceleration force and produces very large current then curing the very short time that the reset charge is being applied to the capacitor from means 25 the opposing accelerometer current may be sufficient to cause the voltage to which the capacitor is reset to be offset from the threshold by less than twice the threshold magnitude, thereby leaving a residual no-zero average voltage on the capacitor and reappearance of the above outlined problems.

In such circumstances where such extreme currents have to be accommodated the arrangement of the FIG. 4 may be modified as shown in FIG. 5.

Most of the components are as shwon and described in FIG. 4 and given the same reference numbers. In addition thereto, the sources 21' and 22", that is, the source of $+V_L$ and $-V_L$, are variable in output, conveniently reducable from a maximum by a control signal on line 37 from voltage control means 38 which determines the average value of capacitor voltage measured by means 32. If the system is coping with the acceleration current level as described above the average value of capacitor voltage is zero and the threshold sources 21' and 22" assume the predetermined levels. If the magnitude of acceleration current increases to the stage where the voltage offset of reset does not cancel the voltage due to charging the voltage control means 38 quickly recognises a residual average capacitor voltage and outputs a control signal that reduces the 'lower' threshold by a corresponding amount such that the capacitor voltage is now offset by the same reset charge from this corresponding lower threshold and the residual average capacitor voltage is eliminated.

Clearly, depending upon the differential between higher and lower thresholds, any reduction in magnitude of $\pm V_L$ may be accompanied by a corresponding increase in magnitude of $\pm V_H$.

Such control over the level of threshold sources $V_L$ may be operated in an open loop mode as described, whereby the magnitude of average capacitor voltage is determined and the voltage thresholds reduced by corresponding specific amounts, or in a closed loop mode with control means 38 continuously monitoring the average capacitor voltage and varying the value of $\pm V_L$ until the average capacitor voltage is restored to zero.

Such threshold voltage level control may be incorporated within the scheme for varying between $V_L$ and $V_H$ in a ccordance with the accelerometer current direction.

It will be appreciated that there are other ways of accommodating the conversion errors due to non-zero average capacitor voltage such as using its value detected at control means 38 to alter the count at means 15 to accommodate that count due to this error.

Although the above current-to-frequency conversion has been described with respect to an accelerometer being a source of bidirectional current and to which the arrangement is particularly applicable when integration is also a requirement it is reiterated that it is appicable to any source of current which may be bidirectional or initially unknown, such as provided by a current emitting device or due to a voltage applied across a known impedance.

I claim:

1. A current-to-frequency converter comprising:
a storage capacitor operable to receive current to be measured and to charge said capacitor positively or negatively with respect to a datum potential in accordance with direction of the current and develop a related charging voltage thereon of positive or negative polarity with respect to said datum; reset means connected across said capacitor and being operable to perform a reset operation on the capacitor, said reset means including voltage sensing means and reset charging means, said voltage sensing means being operable to determine when the charging voltage on the capacitor has reached a preset reset threshold value and said reset charging means being responsive to determination by the voltage sensing means of the preset reset threshold value to apply a predetermined charge to the capacitor in an opposite sense to the current measured to offset the charging voltage on the capacitor by a predetermined reset magnitude; output means connected to said voltage sensing means and said reset charging means for monitoring the number of reset operations occurring over a period of time; said voltage sensing means having a first reset threshold and a second reset threshold, and said reset means being arranged in response to a reset operation, indicative of the polarity of the charging voltage, to adopt for that polarity the first reset threshold of substantially half of the magnitude of the offset voltage and for the opposite polarity, the second reset threshold of a magnitude in excess thereof, said first reset threshold magnitude being lower than the second reset threshold magnitude.

2. A current-to-frequency converter as claimed in claim 1 in which the reset means including means responsive to a reset operation from a higher reset threshold magnitude to set the threshold for that polarity to the lower reset threshold magnitude.

3. A current-to-frequency converter as claimed in claim 1 in which the reset means includes means responsive to the directional sense of reset charge current to set the threshold for the polarity which the reset charge opposes to the lower reset threshold magnitude.

4. A current-to-frequency converter as claimed in claim 1 in which the magnitude of the higher reset threshold is at least 20% greater than the magnitude of the lower rest threshold.

5. A current-to-frequency converter as claimed in claim 1 including voltage control means operable to monitor the average voltage oppearing on the capacitor and responsive to the existance of an average voltage to vary the magnitude of the lower reset threshold.

6. A current-to-frequency converter as claimed in claim 5 in which the voltage control means is arranged to vary the magnitude of the lower reset threshold until the average capacitor voltage is zero.

7. A current-to-frequency converter as claimed in claim 5 in which the voltage control means is arranged to determine the magnitude of average capacitor voltage and offset the lower set threshold by an equal amount.

8. A current-to-frequency converter as claimed in claim 2 including voltage control means operable to monitor the average voltage appearing on the capacitor and responsive to the existance of an average voltage to very the magnitude of the lower reset threshold.

9. A current-to-frequency converter as claimed in claim 2 including voltage control means operable to monitor the average voltage appearing on the capacitor and responsive to the existance of an average voltage to very the magnitude of the lower reset threshold until the average capacitor voltage is zero.

10. An accelerometer including a current-to-frequency converter as claimed in claim 1, connected to said accelerometer, said accelerometer producing said current, to be measured to enable inertial acceleration to be measured, said capacitor being operable to receive said current.

11. An accelerometer including a current-to-frequency converter as claimed in claim 2, connected to said accelerometer, said accelerometer producing said current, to be measured to enable inertial acceleration to be measured, said capacitor being operable to receive said current.

12. An accelerometer including a current-to-frequency converter as claimed in claim 3, said accelerometer producing a current to enable inertial acceleration to be measured, said capacitor being operable to receive said current.

13. An accelerometer including a current-to-frequency converter as claimed in claim 5, connected to said accelerometer, said accelerometer producing said current, to be measured to enable inertial acceleration to be measured, said capacitor being operable to receive said current.

14. An accelerometer including a current-to-frequency converter as claimed in claim 8, connected to said accelerometer, said accelerometer producing said current, to be measured to enable inertial acceleration to be measured, said capacitor being operable to receive said current.

15. An accelerometer including a current-to-frequency converter as claimed in claim 9, connected to said accelerometer, said accelerometer producing said current, to be measured to enable inertial acceleration to be measured, said capacitor being operable to receive said current.

* * * * *

UNITED STATES PATENT AND TRADEMARK OFFICE
CERTIFICATE OF CORRECTION

PATENT NO. : 5,128,610

DATED : July 7, 1992

INVENTOR(S) : Norman F. Watson

It is certified that error appears in the above-identified patent and that said Letters Patent is hereby corrected as shown below:

Col. 8, line 46 (Claim 5, line 3) "oppearing" should be --appearing--.

Col. 8, line 67 (Claim 9, line 5) "very" should be --vary--.

Signed and Sealed this

Twenty-third Day of November, 1993

*Attest:*

BRUCE LEHMAN

*Attesting Officer*     *Commissioner of Patents and Trademarks*